US011892135B2

(12) United States Patent
Epmeier

(10) Patent No.: US 11,892,135 B2
(45) Date of Patent: Feb. 6, 2024

(54) LIGHTING DEVICE, METHOD OF MANUFACTURING A LIGHTING DEVICE AND AUTOMOTIVE HEADLAMP

(71) Applicant: LUMILEDS LLC, San Jose, CA (US)

(72) Inventor: Matthias Epmeier, Aachen (DE)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 17/673,600

(22) Filed: Feb. 16, 2022

(65) Prior Publication Data

US 2022/0260222 A1    Aug. 18, 2022

Related U.S. Application Data

(60) Provisional application No. 63/149,910, filed on Feb. 16, 2021.

(51) Int. Cl.
| | |
|---|---|
| *F21V 19/00* | (2006.01) |
| *F21S 41/19* | (2018.01) |
| *F21S 41/147* | (2018.01) |

(52) U.S. Cl.
CPC .......... *F21S 41/192* (2018.01); *F21S 41/147* (2018.01); *F21V 19/003* (2013.01)

(58) Field of Classification Search
CPC . F21K 9/50; F21K 9/23; F21S 48/1163; F21S 48/1159; F21S 48/1195; F21S 45/47; F21S 41/148; F21S 43/14; F21S 41/141; F21S 41/151; F21Y 2101/02; F21Y 2105/003; F21Y 2115/10; F21Y 2101/00; F21Y 2105/12; F21Y 2107/00; F21Y 2105/10; F21V 29/713; F21V 19/001; H01L 2924/12041; H01L 25/0756; H05K 2201/10106; H05K 2201/09063; H05K 2201/09227; H05K 2201/09736; H05K 2201/09845; H05K 3/10; H05K 1/144; H05K 2201/041; H05K 2201/043
(Continued)

(56) References Cited

U.S. PATENT DOCUMENTS

| | | | |
|---|---|---|---|
| 6,926,432 B2 * | 8/2005 | Rodriguez Barros | ...................... B60R 1/1207 362/800 |
| 10,260,684 B2 * | 4/2019 | Elzinga | ................... H01L 33/32 |

(Continued)

FOREIGN PATENT DOCUMENTS

| | | | | |
|---|---|---|---|---|
| DE | 102019200478 A1 * | 7/2020 | ................ | B41J 2/45 |
| EP | 3907428 | 11/2021 | | |

(Continued)

OTHER PUBLICATIONS

International Search Report and Written Opinion dated May 25, 2022 for PCT International Application No. PCT/US2022/016645.

*Primary Examiner* — Omar Rojas Cadima
(74) *Attorney, Agent, or Firm* — Volpe Koenig

(57) ABSTRACT

A lighting device is described. The lighting device includes a support structure, which includes a central mounting face and at least one first lateral mounting face adjacent the central mounting face and forming an included angle with the central mounting face of 60° to 90°. The device also includes at least one central light emitting element on the central mounting face and in contact with the support structure and at least one first lateral light emitting element on the first lateral mounting face and in contact with the support structure.

17 Claims, 7 Drawing Sheets

(58) Field of Classification Search
USPC ........ 362/487, 466, 516, 520, 545, 547, 382
See application file for complete search history.

(56) References Cited

U.S. PATENT DOCUMENTS

| | | | |
|---|---|---|---|
| 11,280,469 B2* | 3/2022 | Epmeier | F21S 41/151 |
| 2003/0227774 A1* | 12/2003 | Martin | F21V 29/77 |
| | | | 362/240 |
| 2005/0041436 A1* | 2/2005 | Ishida | B60Q 1/18 |
| | | | 362/518 |
| 2007/0045802 A1 | 3/2007 | Chen | |
| 2009/0002997 A1* | 1/2009 | Koester | F21K 9/68 |
| | | | 362/296.01 |
| 2014/0218954 A1* | 8/2014 | Yoon | F21S 43/14 |
| | | | 362/546 |
| 2019/0137065 A1* | 5/2019 | Shibata | F21S 41/39 |
| 2020/0084889 A1 | 3/2020 | Epmeier et al. | |

FOREIGN PATENT DOCUMENTS

| | | |
|---|---|---|
| JP | 5883169 | 3/2016 |
| WO | 2021/225804 | 11/2021 |

\* cited by examiner

LIGHTING DEVICE, METHOD OF MANUFACTURING A LIGHTING DEVICE AND AUTOMOTIVE HEADLAMP

CROSS REFERENCE TO RELATED APPLICATIONS

This application claims the benefit of U.S. Provisional Patent Application No. 63/149,910, which was filed on Feb. 16, 2021, the contents of which are hereby incorporated by reference herein.

BACKGROUND

Lighting devices, such as halogen lamps, have been standard light sources for automotive headlights for many years. However, recent advances in light-emitting diode (LED) technology with concomitant new design possibilities and energy efficiency have spurred interest in finding suitable replacements for halogen lamps based on LED technology, such replacement being often referred to as LED retrofit.

SUMMARY

A lighting device is described. The lighting device includes a support structure, which includes a central mounting face and at least one first lateral mounting face adjacent the central mounting face and forming an included angle with the central mounting face of 60° to 90°. The device also includes at least one central light emitting element on the central mounting face and in contact with the support structure and at least one first lateral light emitting element on the first lateral mounting face and in contact with the support structure.

BRIEF DESCRIPTION OF THE DRAWINGS

A more detailed understanding can be had from the following description, given by way of example in conjunction with the accompanying drawings wherein.

DETAILED DESCRIPTION

Figure 1:
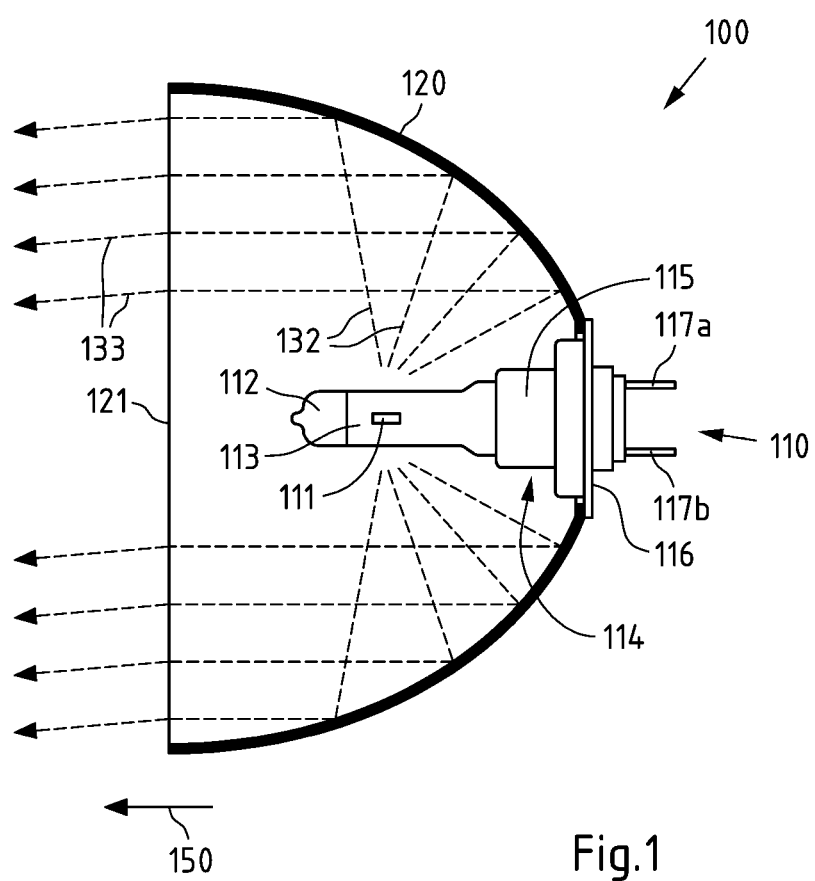
FIG. 1 is a diagram of an example headlight with a halogen lamp.

Examples of different light illumination systems and/or light emitting diode ("LED") implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

While LED retrofits have become popular in recent years, capabilities of LED retrofits in mimicking halogen lamps may not yet be optimal. For example, differing geometries of light emission regions of halogen lamps (e.g., filament) and LED dies (e.g., light emission surfaces) may cause difficulties when LED dies are used for mimicking the light emission of a halogen lamp not only in the near field but also in the far field.

In one approach, LED retrofits may include a Printed Circuit Board (PCB) based support structure where LEDs are arranged on opposing sides of a PCB. However, PCBs may restrict the arrangement on LEDs to a substantially flat or two-dimensional-shape so that mimicking the shape of a filament with PCBs as support structures may not be optimal.

While such an approach may already provide satisfactory results for certain applications, for other applications, such as automotive applications (e.g., headlight applications), light intensity distribution may not mimic a corresponding light intensity distribution of a halogen lamp such that it may not meet requirements for such applications. At the same time, it may be desirable to enable coping with large heat densities to be expected from LEDs mimicking halogen lamps, such as in automotive headlight applications.

Embodiments described herein may provide for a lighting device with improved capability to mimic light emission properties of a halogen lamp. Additionally, a lighting device may be provided with improved capability to cope with large heat densities. A method of manufacturing such a lighting device is also described.

FIG. 1 shows a headlight 100 with a reflector 120 to which an example H7 halogen lamp 110 is mounted. In the example illustrated in FIG. 1, a filament 111 of the halogen lamp 110 is placed at a focus of the reflector 120 such that light 132 emitted from filament 111 is reflected by the reflector 120 along a main lighting direction 150. A cover 121 may incorporate suitable optics for shaping the reflected light and to form light 133 leaving the headlight 100. The Lamp 110 may include a socket 114 mounted to the reflector 120 via a mounting portion 116. Pins 117*a* and 117*b* may extend from the socket 114 for power connection. A Bulb 113 may extend from a base portion 115 surrounding the filament 111 and may end in a light blocking portion 112, which may block direct light from the filament 111.

Figure 2:
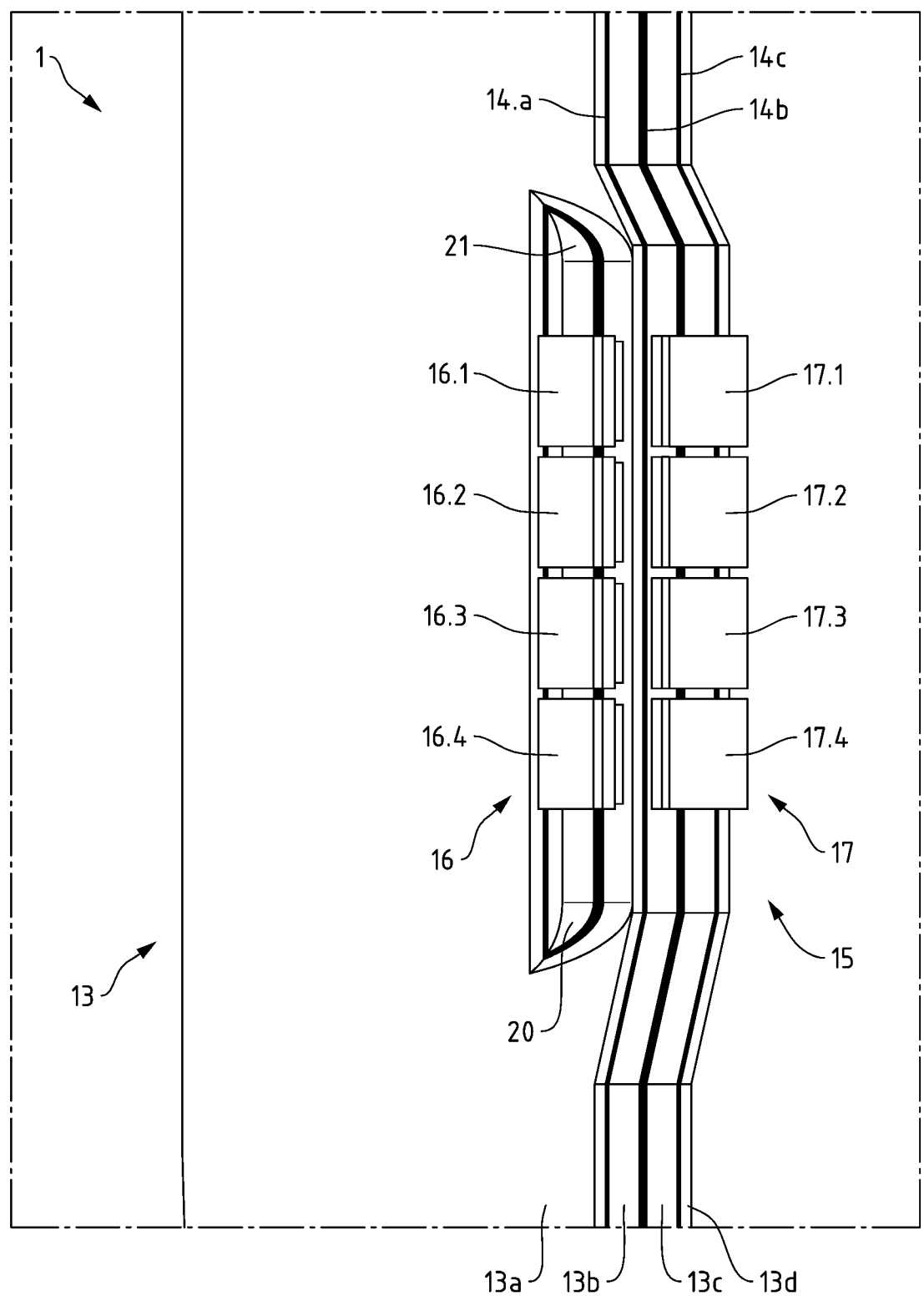
FIG. 2 shows an example lighting device.

FIG. 2 shows an example lighting device 1. The lighting device 1 may be an LED retrofit, which may be connected to a corresponding automotive headlight (not shown). Replacing bulb 113 and filament 111 of FIG. 1, lighting device 1 may include a support structure 13 and arrangements of LEDs along an arrangement direction, which may be examples of light emitting elements.

As can be taken from FIG. 2, the support structure 13 may include a metal core board. The metal core board may include four conductive layers 13*a*, 13*b*, 13*c* and 13*d*. The four conductive layers 13*a*, 13*b*, 13*c* and 13*d* may make up one first lateral conductor segment 13*a*, one first central conductor segment 13*b*, one second central conductor segment 13*c* and one second lateral conductor segment 13*d*. Insulating layers 14*a*, 14*b* and 14*c* may be arranged in between the conductor layers 13*a*, 13*b*, 13*c* and 13*d*. The conductor segments 13*a*, 13*b*, 13*c* and 13*d* may extend substantially parallel to the extension direction of the support structure 13.

A longitudinal mounting section 15 may protrude from the support structure 13 and include a first lateral mounting face 16, a central mounting face 17 and a second lateral mounting face 18.

In some embodiments, the support structure may include one metal core board, such as an insulated metal substrate (IMS) board, and the metal core board may include at least four conductive layers. It is noted that also more than one IMS-board may be employed if required or desired. The IMS-board may be a printed circuit board (PCB).

In some embodiments, the conductor segments may correspond to a metal sheet, such as a copper sheet, cut into respective segments, for example using a thin laser beam. The conductor segments may be attached (e.g., glued) to an insulating layer.

The at least four conductive layers may include one first lateral conductor segment, one first central conductor segment, one second central conductor segment and one second lateral conductor segment. In some embodiments, the mounting faces may include at least two contact sections of conductive layers along the arrangement direction respectively. Contact sections may, for example, be configured as contact patches or contact areas on the surface of the mounting face(s) that may allow for an electrical contact with a light-emitting device, for instance by soldering or by means of a conductive adhesive. Each contact section may correspond to a conductor and may, therefore, be electrically coupled to the body section such that, for instance, a voltage may be applied between neighboring contact sections when the body section is connected to a power source.

A voltage may be applied between any of the at least two contact sections when the body section is connected to a power source. For instance, in case of two contact sections, a voltage may be applied between those two contact sections. In case of more than two (e.g., three) contact sections, a voltage may be applied between any two of the three contact sections. For instance, a voltage may be applied between a first and second contact section, and/or between the first and a third contact section, and/or between the second and the third contact section, to name but a few non-limiting examples. Further, in case of a plurality of contact sections (e.g., at least two contact sections), it may be enabled to, for instance, apply a voltage between two different contact sections when the body section is connected to a power source. In this way, in case of a plurality of light-emitting elements being arranged on the mounting faces, individual combinations of the plurality of light-emitting elements may be addressed to emit light when the body section is connected to a power source.

As already mentioned above, the body section may provide an electrical connection to the at least one mounting face and may act simultaneously as a heat sink as well as a heat conductor, which may be particularly advantageous when light-emitting elements with a high heat output are used, such as LED light sources for high current applications, such as automotive head lighting.

By providing a support structure with one first lateral conductor segment, one first central conductor segment, one second central conductor segment and one second lateral conductor segment, conductor segments and/or contact sections for the light emitting devices can be provided in a constructively advantageous way. In some embodiments, the conductor segments and/or the contact sections may extend essentially perpendicular to the central mounting face.

According to some embodiments, the at least one first light emitting element may be electrically coupled to the first lateral conductor segment and to the first central conductor segment. The at least one central emitting element electrically may be connected to the first central conductor segment and to the second central conductor segment, and the at least one second light emitting element may be electrically connected to the second central conductor segment and to the second lateral conductor segment. As already mentioned above, the conductor segments may extend essentially perpendicular to the central mounting face. Due to the angle of the first lateral mounting face and the second lateral mounting face to the central mounting face, such as the angle of the angled sections to the central mounting face, both the first lateral mounting face and the second lateral mounting face may include parts of either the first lateral conductor segment and the first central conductor segment or the second central conductor segment and the second lateral conductor segment. Hereby, the at least one first light emitting element and the at least one second light emitting element may be electrically connected to the conductor segments in a constructively advantageous way.

In some embodiments, the support structure may be formed by essentially planar conductor segments (which may be bent one or more times in accordance with an application) arranged parallel and adjacent to each other. Insulating layers (e.g., a dielectric insulating material) may be arranged in between the conductors. Using a dielectric insulating material may be beneficial, for example, in terms of corresponding properties to withstand and to conduct heat. The insulating layers may, for example, be insulating layers sandwiched by the conductive layers. For example, the insulating layers may be arranged in direct contact with conductive layers. Suitable materials may include, for example, highly conductive dielectric materials, a PrePreg with suitable particles, phase change sheets or resin coated copper (RCC).

Figure 3:
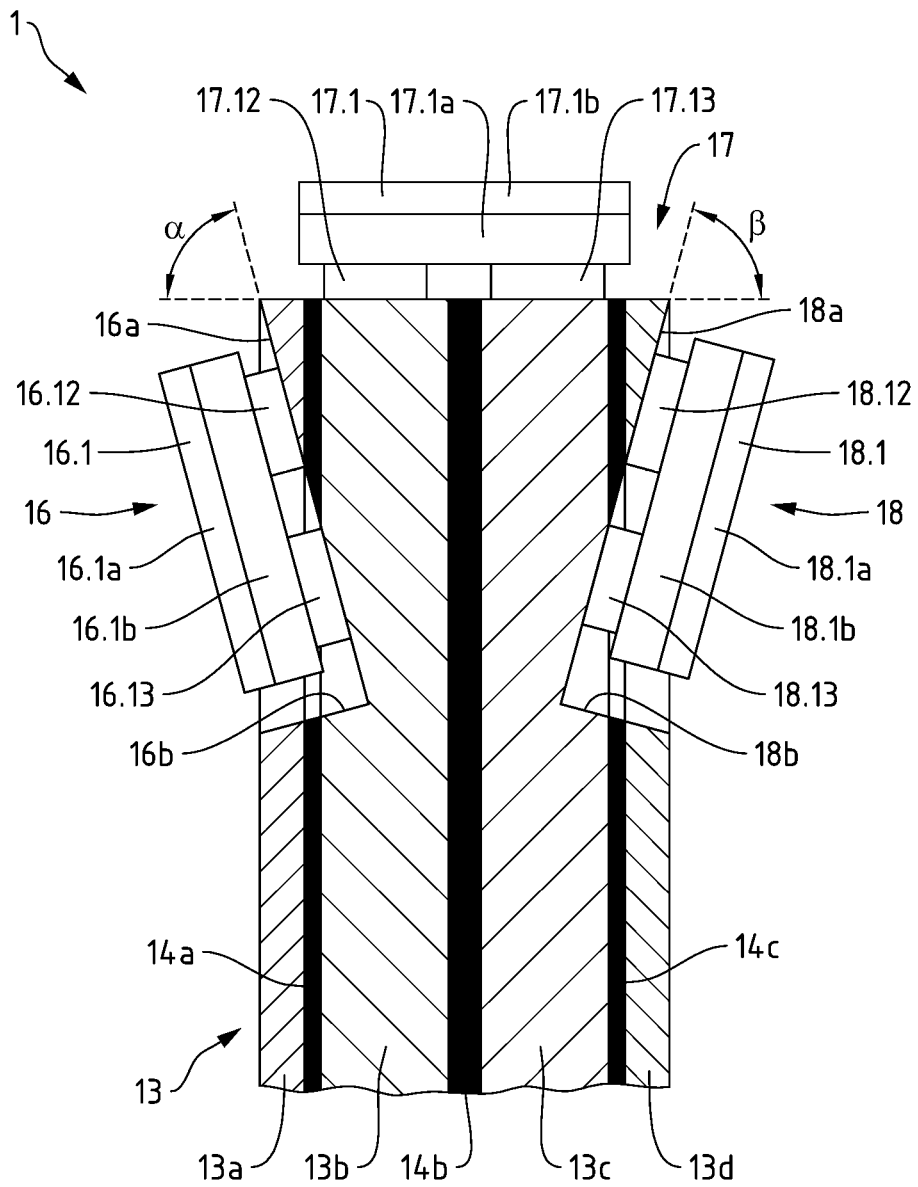
FIG. 3 is a cross-sectional view of a mounting section of the lighting device of FIG. 2.

FIG. 3 is a cross-sectional view of a mounting section of the lighting device of FIG. 2 In the example illustrated in FIG. 3, the first lateral mounting face 16 and the second lateral mounting face 18, including angled sections 16a and 18a of the first lateral mounting face 16 and the second lateral mounting face 18, may form included angles α and β in the range of 60° to 75° with the central mounting face 17. The angled sections 16a and 18a may be formed adjacent to the central mounting face 17 and may be bordered by delimiting surfaces 16b and 18b of the first and the second lateral mounting faces 16 and 18. Additionally, the first lateral mounting face 16 may be delimited on both sides via chamfers 20 and 21. The first and the second lateral mounting faces 16 and 18 may be arranged mutually opposing.

An arrangement of first lateral LEDs 16.1, 16.2, 16.3 and 16.4 may be linearly arranged along an arrangement direction of the first lateral mounting face 16. Similarly, an arrangement of second lateral LEDs 18.1, 18.2, 18.3 and 18.4 may be linearly arranged along an arrangement direction of the second lateral mounting face 18 and is not visible in FIG. 2 due to the perspective. The central mounting face 17 may include an arrangement of central LEDs 17.1, 17.2, 17.3 and 17.4. Because of the angled and/or inclined sections 16a and 18a with respect to the central mounting face 17 and the central LEDs 17.1, 17.2, 17.3 and 17.4, a lighting device can be provided that mimics the emission characteristics of the halogen lamp 110 as shown in FIG. 1. The LEDs may include a LED die 16.1a, 17.1a and 18.1a and a transparent light guiding layer 16.1b, 17.1b and 18.1b, respectively.

The LED die 16.1a of the first lateral LED 16.1 may be soldered to the first lateral conductor segment 13a and to the first central conductor segment 13b via solder bumps 16.12 and 16.13. The LED die 17.1a of the central LED 17.1 may be soldered to the first central conductor segment 13b and to the second central conductor segment 13c via solder bumps 17.12 and 17.13. The LED die 18.1a of the second lateral LED 18.1 may be soldered to the second central conductor segment 13c and to the second lateral conductor segment 13d via solder bumps 18.12 and 18.13. By soldering, the LEDs 16.1, 17.1 and 18.1 may be in mechanical and electrical contact with the respective conductive layers 13a, 13b, 13c and 13d. In some embodiments, all LEDs may be arranged on the respective mounting faces 16, 17 and 18 in a similar way. Hereby, the LEDs may be electrically controlled, and heat generated by the LEDs may be guided away beneficially by the support structure 13. Also, a beneficially compact design may be provided by sharing the conductive layers 13a, 13b, 13c and 13d between the mounting faces 16, 17 and 18.

In some embodiments, the four LEDs on the respective mounting faces 16, 17 and 18 may be electrically coupled in series, which may advantageously enable use of the LEDs in complex control electronics for operating the lighting device.

In some embodiments, the mounting faces may be at least partially flat or planar to provide an area suitable to accommodate a light-emitting element, such as an LED and/or an LED die. The mounting faces may have an arrangement direction and may be configured for accommodating at least one light-emitting element arranged along the arrangement direction. The arrangement direction may correspond to an extension direction of the mounting faces and/or the light emitting elements. For instance, the arrangement direction may correspond to a longest dimension of the mounting faces and/or the light emitting elements. The mounting faces may, in particular, be configured such that multiple light-emitting elements may be arranged along a line, for example, a straight line, and the arrangement direction may correspond to the orientation of the line of light-emitting elements. In some embodiments, the at least one mounting face may be configured to accommodate only a single light-emitting element, and the light-emitting element may have, for instance, an elongated (e.g., rectangular) shape with the arrangement direction corresponding to the direction of elongation.

In some embodiments, the arrangement direction may correspond to the extension direction of a filament (e.g., in a headlight such as the headlight 100 of FIG. 1), which may be, for example, the longest dimension of the filament.

A body section may be arranged adjacent to the mounting faces, and the body section may be in thermal contact to the mounting faces, such that, for example, heat generated by one or more light-emitting element mounted on the mounting faces may be transferred from the mounting faces to the body section. The body section may include a volume and/or surface configured to provide heat dissipation suitable for the heat generated by light-emitting elements and to provide cooling for the light-emitting elements.

By forming an included angle of 60° to 90° with the central mounting face, such as an included angle of 60° to 75° with the central mounting face, the at least one first light emitting element may form a negative and/or an inclined angle with regard to the at least one central light emitting element arranged on the at least one central mounting face. The included angle may be defined as the angle included by the central mounting face and the first lateral mounting face (e.g., included by the central mounting face and an angled section of the first lateral mounting face). In some embodiments, the adjacent section may be adjacent to the central mounting face. Hereby, the emission pattern of a traditional filament may be mimicked and a compliant beam distribution may be reached. Additionally, it may be possible to use standardized top-emitting light emitting elements, which can be arranged on the first lateral mounting face such that it may not be necessary to alter the standardized top-emitting light emitting elements. In this way, it may become possible to meet requirements for near and far field intensity distribution that may exist, for example, in the automotive field such that the lighting device may advantageously be employed as a light source for an automotive headlight. At the same time, while being highly advantageous for such application, the lighting device may also be suitably employed as a light source also in different applications, such as in flashlight applications, projector applications, etc.

In some embodiments, the at least one first lateral light emitting element may be in mechanical, electrical and/or thermal contact with the first lateral mounting face, the at least one central light emitting element may be in mechanical, electrical and/or thermal contact with the central mounting face, and the at least one second lateral light emitting element may be in mechanical, electrical and/or thermal contact with the at least one second lateral mounting face.

According to some embodiments, at least one second lateral mounting face may be formed by the support structure, and the second lateral mounting face may be arranged opposing to the first lateral mounting face and adjacent to the central mounting face forming an included angle of 60° to 90°, such as an included angle of 60° to 75°, with the central mounting face. At least one second lateral light emitting element may be arranged on the second lateral mounting face in contact with the support structure. In other words, light emitting elements may be arranged on three different adjacent faces of the support structure and may, thus, advantageously be arranged for mimicking a three-dimensional structure of a filament. In some embodiments, the first and the second lateral mounting faces may include angled sections, which may be adjacent and inclined with regard to the central mounting face. Being arranged in this way, the light emitting elements may not only be arranged beneficially for mimicking the filament near field but, in addition, also its far field. By arranging both the at least one first light emitting element and the at least one second light emitting element with an inclined angle to the at least one central light emitting element, a three-dimensional arrangement of light emitting elements may be achieved that may be optimized for mimicking the filament of a traditional halogen lamp. Thus, in some embodiments, the central mounting face, the first lateral mounting face and the second lateral mounting face may be faces of a longitudinal mounting section in an arrangement direction protruding from the support structure.

In some embodiments, the first and the second lateral mounting face may include an angled section, respectively. The angled sections may be formed adjacent to the central mounting face. The angled section of the first lateral mounting faces may be bordered by a delimiting surface of the first lateral mounting face. The angled section of the second lateral mounting face may be bordered by a delimiting surface of the second lateral mounting face. In some embodiments, the at least one first lateral light emitting element and the at least one second lateral light emitting element may be arranged on the angled sections of the first and the second lateral mounting faces. The delimiting surfaces may extend perpendicular from the angled sections of the first lateral mounting face and the second lateral mounting face. The delimiting surfaces may further enhance the emission characteristics of the lighting device by reducing overlapping emissions of the light emitting elements and by increasing the illumination.

In some embodiments, the delimiting surface of the first lateral mounting face may act as a mechanical stop for the at least one first lateral light emitting element, and the delimiting surface of the second lateral mounting face may act as a mechanical stop for the at least one second lateral light emitting element. The at least one first lateral light emitting element and the at least one second lateral light emitting element may preferably be arranged on the first lateral mounting face and the second lateral mounting face via a pick and place procedure after solder is applied to the respective mounting faces. The delimiting surfaces may act as a mechanical stop so that the light emitting elements may self-align on the respective lateral mounting faces. This may lead to a controlled assembling of light emitting elements and may prevent short circuits due to the defined placement of the light emitting elements.

In some embodiments, the central mounting face, the first lateral mounting face and the second lateral mounting face may be faces of a longitudinal mounting section protruding from the support structure.

In some embodiments, the lighting device may include an arrangement of three to six first lateral light emitting elements (e.g., four to five first lateral light emitting elements), which may be arranged along an arrangement direction of the first lateral mounting face, an arrangement of three to six central light emitting elements (e.g., four to five central light emitting elements), arranged along an arrangement direction of the central mounting face, and an arrangement of three to six second lateral light emitting elements (e.g., four to five second lateral light emitting elements), arranged along an arrangement direction of the second lateral mounting face. By arranging more than one light emitting element on each of the central and the two lateral mounting faces along the arrangement direction, a three-dimensional arrangement of light emitting elements may be achieved, which may be optimized for mimicking the filament of an aforementioned halogen lamp.

In some embodiments, the at least one second lateral mounting face may be formed by a portion of the support structure by milling the second lateral mounting face into the support structure. The second lateral mounting face may include an included angle of 60° to 90°, such as an included angle of 60° to 75°, with the central mounting face, and the at least one second lateral light emitting element may be arranged on the second lateral mounting face.

Figure 4:
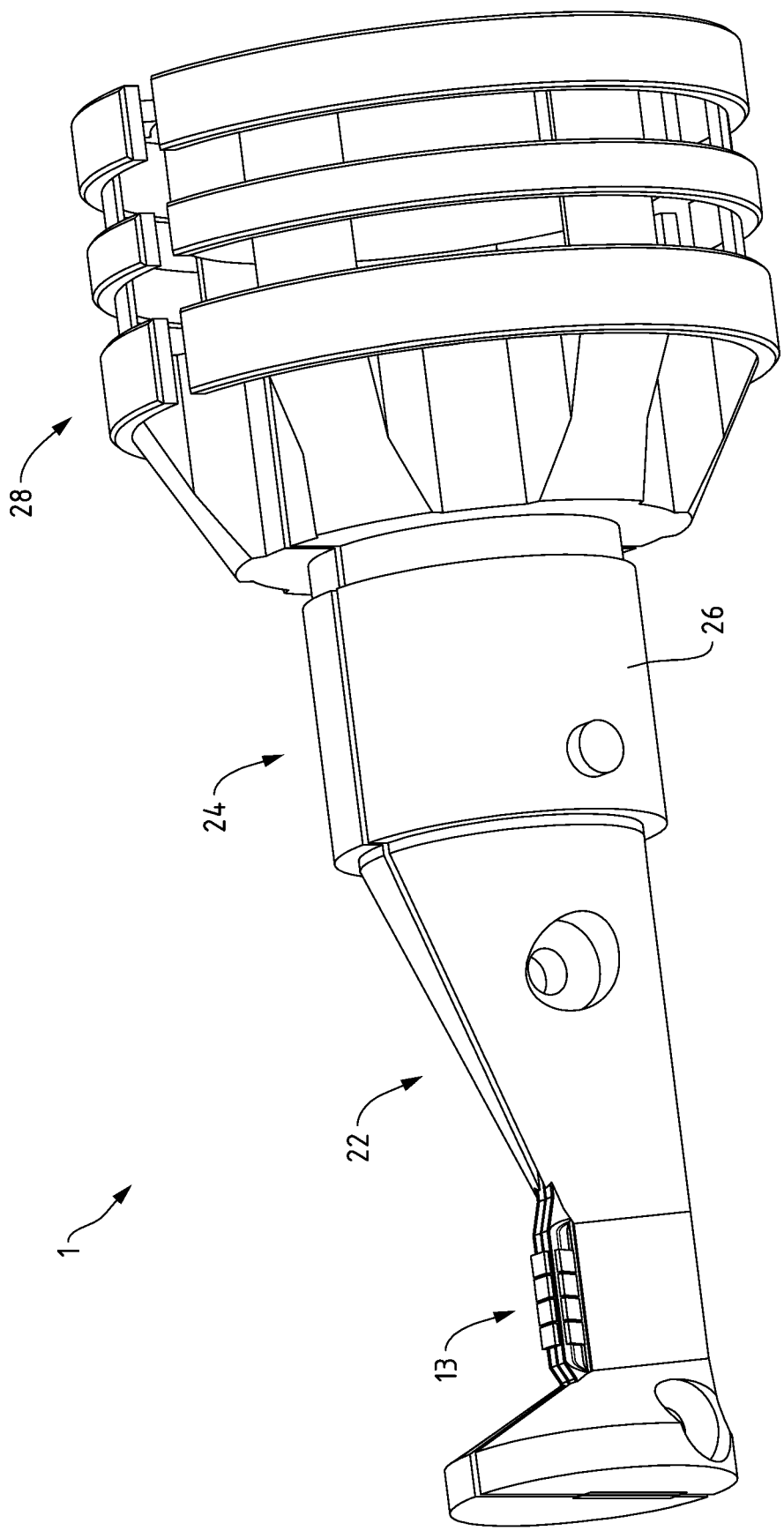
FIG. 4 shows an example lighting device.

FIG. 4 shows an example lighting device 1. In the example illustrated in FIG. 4, the lighting device 1 may include a head part 22 and a base part 24. The head part 22 of the lighting device 1 may include the support structure 13 including the mounting faces 16, 17 and 18. A heat dissipation member 26 may extend from the head part 22 to the base part 24 and may be mechanically coupled to a heat sink 28 to further support transport of heat from the LEDs.

In some embodiments, the lighting device may be a light source, such as a lamp, for example, which may be configured to be mounted to a lighting system, such as an automotive headlight. Different lighting systems may include, for example, projector systems, flashlights, reflectors and/or projector systems. In a vehicular context, typical applications may include low beam, high beam, fog, and/or DRL applications. Being configured in this way, the lighting device may further include, for example, a suitable socket for mounting the lighting device to such lighting system.

Figure 5:
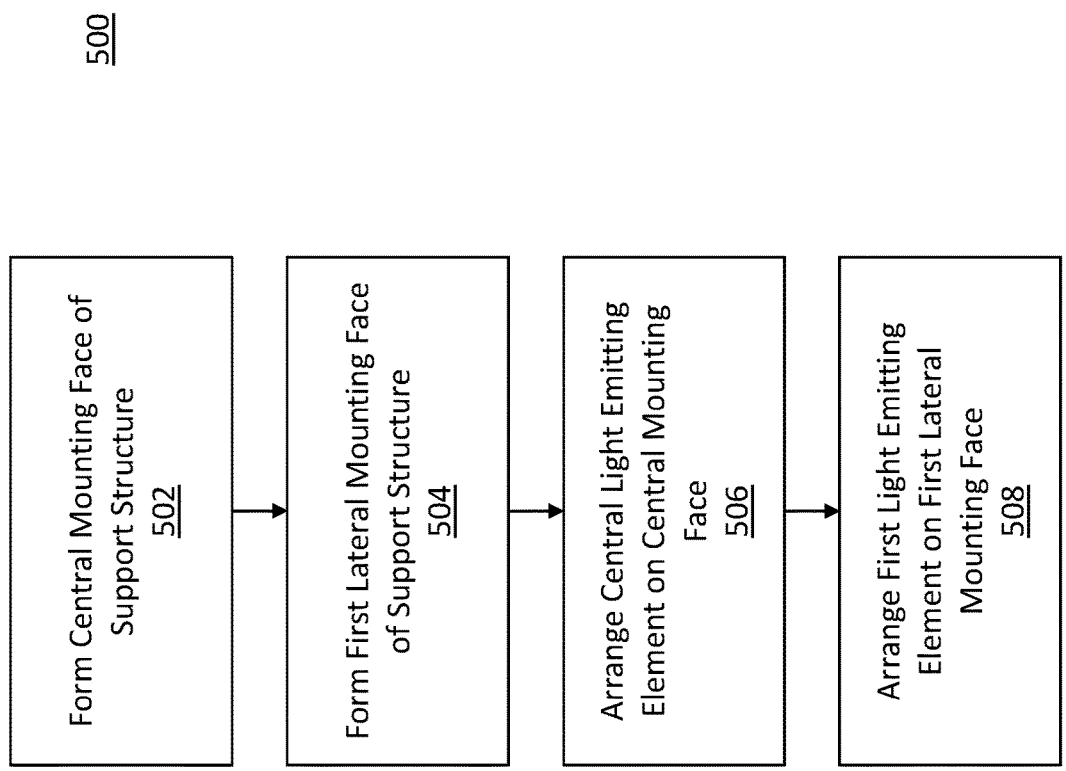
FIG. 5 is a flow diagram of an example method of manufacturing a lighting device.

FIG. 5 is a flow diagram of an example method of manufacturing a lighting device. In the example illustrated in FIG. 5, the method includes forming a central mounting face of a support structure (502). At least one first lateral mounting face of the support structure may be formed (504). In some embodiments, the at least one lateral mounting face may be formed by milling the at least one lateral mounting face into the support structure. The first lateral mounting face may be formed at an included angle with the central mounting face. In some embodiments, the included angle may 60° to 90°. In some embodiments, the included angle may be 60° to 75°. A central light emitting element may be arranged on the mounting face (506). Further, a first light emitting element may be formed on the first lateral mounting face (508).

In some embodiments, at least one second lateral mounting face of the support structure may be formed. In some embodiments, the at least one second lateral mounting face may be formed by milling the at least one second lateral mounting face into the support structure. The second lateral mounting face may be formed at an included angle with the central mounting face. In some embodiments, the included angle may 60° to 90°. In some embodiments, the included angle may be 60° to 75°. At least one second lateral light emitting element may be arranged on the second lateral mounting face.

Figure 6:
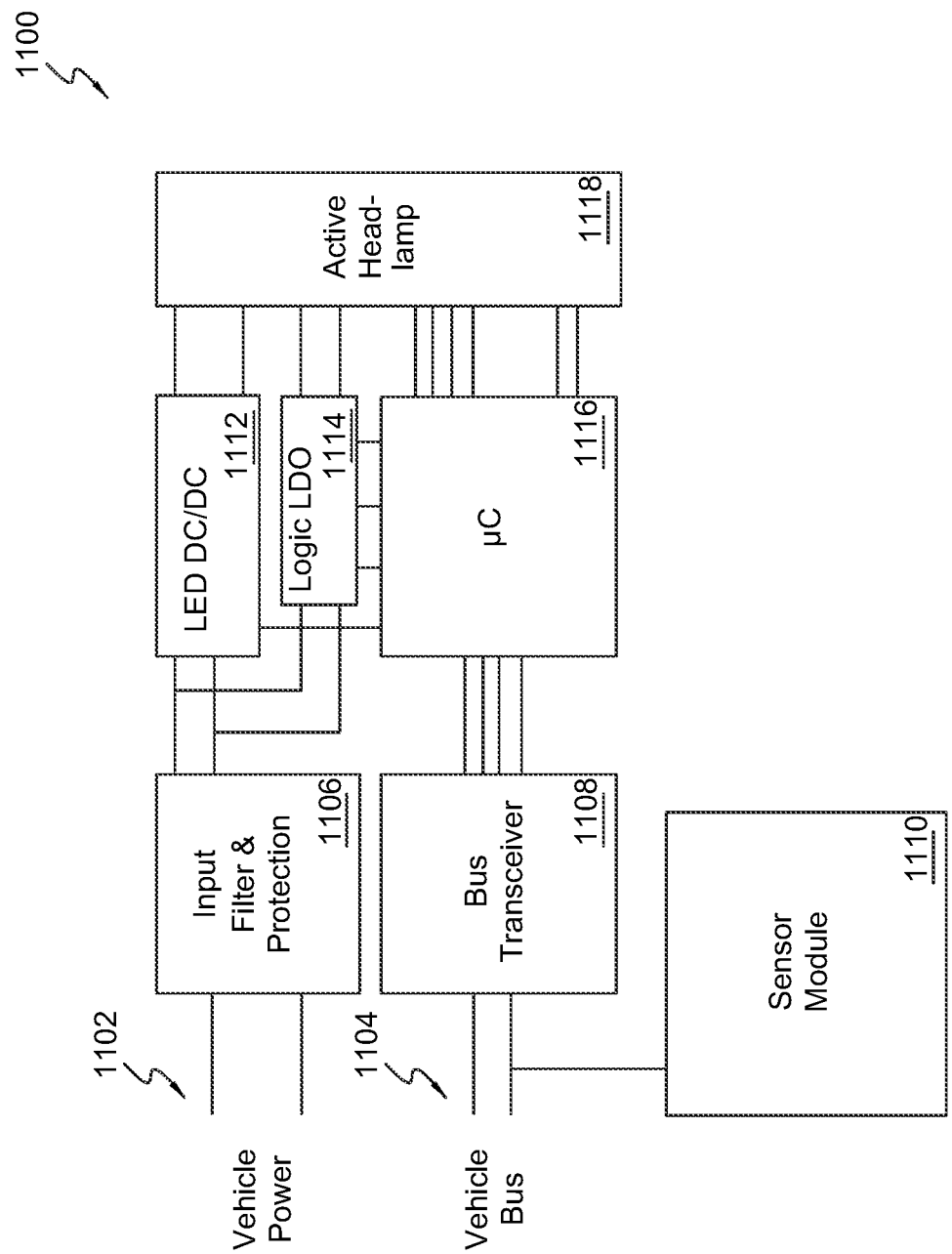
FIG. 6 is a diagram of an example vehicle headlamp system.

FIG. 6 is a diagram of an example vehicle headlamp system 600 that may incorporate one or more of the embodiments and examples described herein. The example vehicle headlamp system 600 illustrated in FIG. 6 includes power lines 602, a data bus 604, an input filter and protection module 606, a bus transceiver 608, a sensor module 610, an LED direct current to direct current (DC/DC) module 612, a logic low-dropout (LDO) module 614, a micro-controller 616 and an active head lamp 618.

The power lines 602 may have inputs that receive power from a vehicle, and the data bus 604 may have inputs/outputs over which data may be exchanged between the vehicle and the vehicle headlamp system 600. For example, the vehicle headlamp system 600 may receive instructions from other locations in the vehicle, such as instructions to turn on turn signaling or turn on headlamps, and may send feedback to other locations in the vehicle if desired. The sensor module 610 may be communicatively coupled to the data bus band may provide additional data to the vehicle headlamp system 600 or other locations in the vehicle related to, for example, environmental conditions (e.g., time of day, rain, fog, or ambient light levels), vehicle state (e.g., parked, in-motion, speed of motion, or direction of motion), and presence/position of other objects (e.g., vehicles or pedestrians). A headlamp controller that is separate from any vehicle controller communicatively coupled to the vehicle data bus may also be included in the vehicle headlamp system 600. In FIG. 6, the headlamp controller may be a micro-controller, such as micro-controller (μc) 616. The micro-controller 616 may be communicatively coupled to the data bus 604.

The input filter and protection module 706 may be electrically coupled to the power lines 602 and may, for example, support various filters to reduce conducted emissions and provide power immunity. Additionally, the input filter and protection module 706 may provide electrostatic discharge (ESD) protection, load-dump protection, alternator field decay protection, and/or reverse polarity protection.

The LED DC/DC module 612 may be coupled between the input filter and protection module 106 and the active headlamp 618 to receive filtered power and provide a drive current to power LEDs in the LED array in the active headlamp 618. The LED DC/DC module 612 may have an input voltage between 7 and 18 volts with a nominal voltage of approximately 13.2 volts and an output voltage that may be slightly higher (e.g., 0.3 volts) than a maximum voltage for the LED array (e.g., as determined by factor or local calibration and operating condition adjustments due to load, temperature or other factors).

The logic LDO module 614 may be coupled to the input filter and protection module 606 to receive the filtered power. The logic LDO module 614 may also be coupled to the micro-controller 616 and the active headlamp 618 to provide power to the micro-controller 616 and/or electronics in the active headlamp 618, such as CMOS logic.

The bus transceiver 608 may have, for example, a universal asynchronous receiver transmitter (UART) or serial peripheral interface (SPI) interface and may be coupled to the micro-controller 616. The micro-controller 616 may translate vehicle input based on, or including, data from the sensor module 610. The translated vehicle input may include a video signal that is transferrable to an image buffer in the active headlamp 618. In addition, the micro-controller 616 may load default image frames and test for open/short pixels during startup. In embodiments, an SPI interface may load an image buffer in CMOS. Image frames may be full frame, differential or partial frames. Other features of micro-controller 616 may include control interface monitoring of CMOS status, including die temperature, as well as logic LDO output. In embodiments, LED DC/DC output may be dynamically controlled to minimize headroom. In addition to providing image frame data, other headlamp functions, such as complementary use in conjunction with side marker or turn signal lights, and/or activation of daytime running lights, may also be controlled.

Figure 7:
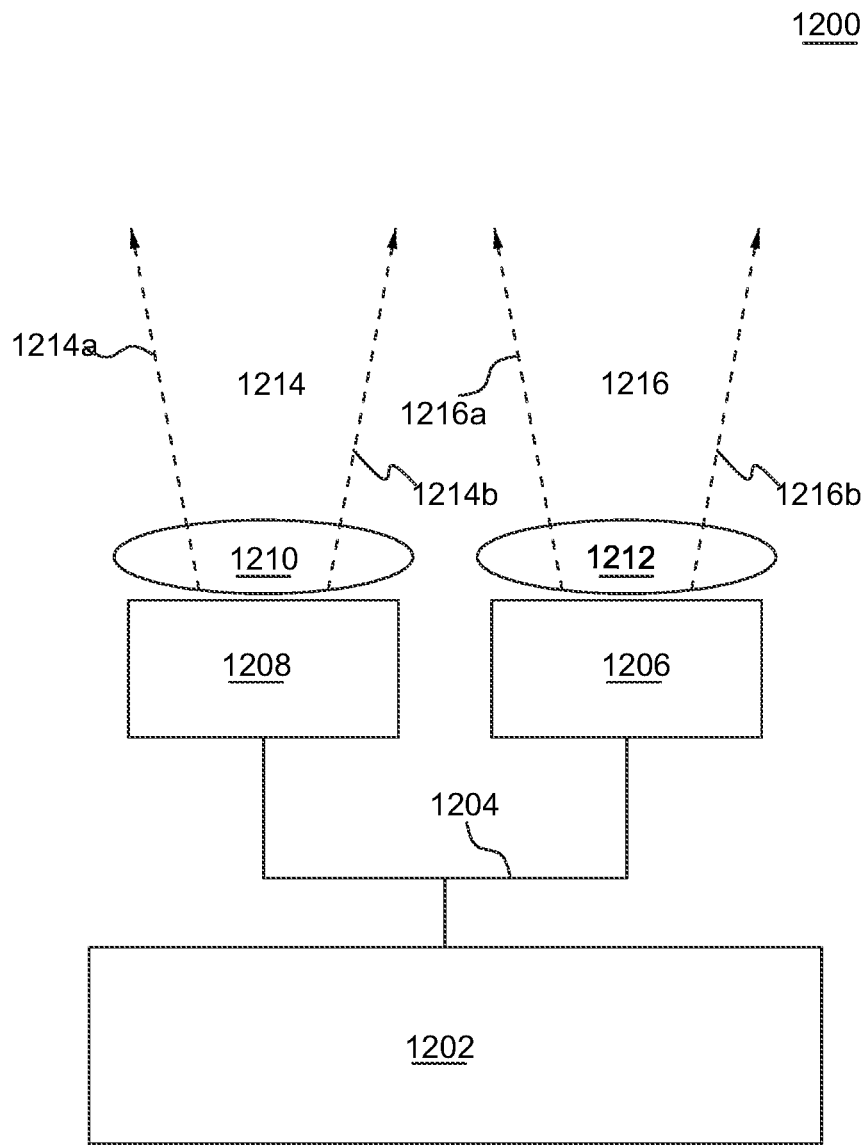
FIG. 7 is a diagram of another example vehicle headlamp system.

FIG. 7 is a diagram of another example vehicle headlamp system 700. The example vehicle headlamp system 700 illustrated in FIG. 7 includes an application platform 702, two LED lighting systems 706 and 708, and secondary optics 710 and 712.

The LED lighting system 708 may emit light beams 714 (shown between arrows 714a and 714b in FIG. 7). The LED lighting system 706 may emit light beams 716 (shown between arrows 716a and 716b in FIG. 7). In the embodiment shown in FIG. 7, a secondary optic 710 is adjacent the LED lighting system 808, and the light emitted from the LED lighting system 708 passes through the secondary optic 710. Similarly, a secondary optic 712 is adjacent the LED lighting system 706, and the light emitted from the LED lighting system 706 passes through the secondary optic 712. In alternative embodiments, no secondary optics 710/712 are provided in the vehicle headlamp system.

Where included, the secondary optics 710/712 may be or include one or more light guides. The one or more light guides may be edge lit or may have an interior opening that defines an interior edge of the light guide. LED lighting systems 708 and 706 may be inserted in the interior openings of the one or more light guides such that they inject light into the interior edge (interior opening light guide) or exterior edge (edge lit light guide) of the one or more light guides. In embodiments, the one or more light guides may shape the light emitted by the LED lighting systems 708 and 706 in a desired manner, such as, for example, with a gradient, a chamfered distribution, a narrow distribution, a wide distribution, or an angular distribution.

The application platform 702 may provide power and/or data to the LED lighting systems 706 and/or 708 via lines 704, which may include one or more or a portion of the power lines 602 and the data bus 604 of FIG. 6. One or more sensors (which may be the sensors in the vehicle headlamp system 700 or other additional sensors) may be internal or external to the housing of the application platform 702. Alternatively, or in addition, as shown in the example vehicle headlamp system 600 of FIG. 6, each LED lighting system 708 and 706 may include its own sensor module, connectivity and control module, power module, and/or LED array.

In embodiments, the vehicle headlamp system 700 may represent an automobile with steerable light beams where LEDs may be selectively activated to provide steerable light. For example, an array of LEDs or emitters may be used to define or project a shape or pattern or illuminate only selected sections of a roadway. In an example embodiment, infrared cameras or detector pixels within LED lighting systems 806 and 808 may be sensors (e.g., similar to sensors in the sensor module 610 of FIG. 6) that identify portions of a scene (e.g., roadway or pedestrian crossing) that require illumination.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

What is claimed is:

1. A lighting device comprising:
   a support structure comprising:
      one metal core board having at least four stacked conductive layers,
      a central mounting face on a surface of the one metal core board, and
      at least one first lateral mounting face adjacent the central mounting face and forming an included angle with the central mounting face of 60° to 75° such that at least a portion of the at least one first lateral mounting face protrudes into the one metal core board;

at least one central light emitting element on the central mounting face and in contact with the support structure; and at least one first lateral light emitting element on the first lateral mounting face and in contact with the support structure.

2. The lighting device according to claim 1, wherein the support structure further comprises at least one second lateral mounting face, opposing to the first lateral mounting face, and at another included angle with the central mounting face of 60° to 90°.

3. The lighting device according to claim 2, wherein the other included angle is 60° to 75° such that at least a portion of the at least one second lateral mounting face protrudes into the one metal core board.

4. The lighting device according to claim 2, further comprising a second lateral light emitting element on the second lateral mounting face and in contact with the support structure.

5. The lighting device according to claim 1, wherein the one metal core board is an insulated metal substrate board.

6. The lighting device according to claim 1, wherein the at least four stacked conductive layers comprise one first lateral conductor segment, one first central conductor segment, one second central conductor segment and one second lateral conductor segment.

7. The lighting device according to claim 6, wherein:
the at least one first lateral light emitting element is electrically coupled to the first lateral conductor segment and the first central conductor segment,
the at least one central light emitting element is electrically coupled to the first central conductor segment and the second central conductor segment, and
the at least one second lateral light emitting element is electrically coupled to the second central conductor segment and the second lateral conductor segment.

8. The lighting device according to claim 1, wherein the support structure further comprises insulating layers in between the conductor segments.

9. The lighting device according to claim 2, wherein the first and the second lateral mounting face each comprise an angled section adjacent to the central mounting face, the angled section of the first lateral mounting face being bordered by a delimiting surface of the first lateral mounting face, and the angled section of the second lateral mounting face being bordered by a delimiting surface of the second lateral mounting face.

10. The lighting device according to claim 9, wherein the delimiting surfaces extend perpendicular from the angled sections of the first lateral mounting face and the second lateral mounting face.

11. The lighting device according to claim 9, wherein:
the delimiting surface of the first lateral mounting face acts as a mechanical stop for the at least one first lateral light emitting element, and
the delimiting surface of the second lateral mounting face acts as a mechanical stop for the at least one second lateral light emitting element.

12. The lighting device according to claim 2, wherein the central mounting face, the first lateral mounting face and the second lateral mounting face are faces of a longitudinal mounting section protruding from the support structure.

13. The lighting device according to claim 12, further comprising:
an arrangement of three to six first lateral light emitting elements arranged along an arrangement direction of the first lateral mounting face,
an arrangement of three to six central light emitting elements arranged along an arrangement direction of the central mounting face, and
an arrangement of three to six second lateral light emitting elements arranged along an arrangement direction of the second lateral mounting face.

14. The lighting device according to claim 13, wherein the three to six first lateral light emitting elements, the three to six central light emitting elements, and the arrangement of three to six second lateral light emitting elements comprises four to five first lateral light emitting elements, four to five central light emitting elements, and four to first second lateral light emitting elements.

15. A method of manufacturing a lighting device, the method comprising:
providing a support structure, the providing the support structure comprising:
providing one metal core board having at least four stacked conductive layers,
forming a central mounting face on a surface of the one metal core board, and
forming at least one first lateral mounting face of the support structure by milling the first lateral mounting face at an included angle of 60° to 75° with the central mounting face such that at least a portion of the at least one first lateral mounting face protrudes into the one metal core board;
arranging at least one central light emitting element on the central mounting face; and
arranging at least one first lateral light emitting element on the first lateral mounting face.

16. The method according to claim 15, wherein the method further comprises:
forming at least one second lateral mounting face of the support structure by milling the second lateral mounting face into the support structure at an included angle of 60° to 90° with the central mounting face; and
arranging at least one second lateral light emitting element on the second lateral mounting face.

17. Automotive headlight comprising:
a reflector; and
a lighting device mounted at a focal point of the reflector, the lighting device comprising:
a support structure comprising:
one metal core board having at least four stacked conductive layers, and
a central mounting face on a surface of the one metal core board at least one first lateral mounting face adjacent the central mounting face and forming an included angle with the central mounting face of 60° to 90°,
wherein the at least four stacked conductive layers comprise one first lateral conductor segment, one first central conductor segment, one second central conductor segment and one second lateral conductor segment, and
wherein the at least one first lateral light emitting element is electrically coupled to the first lateral conductor segment and the first central conductor segment, wherein the at least one central light emitting element is electrically coupled to the first central conductor segment and the second central conductor segment, and wherein the at least one second lateral light emitting element is electrically coupled to the second central conductor segment and the second lateral conductor segment;

at least one central light emitting element on the central mounting face and in contact with the support structure; and at least one first lateral light emitting element on the first lateral mounting face and in contact with the support structure.

* * * * *